(12) United States Patent
Weigell et al.

(10) Patent No.: US 11,567,551 B2
(45) Date of Patent: Jan. 31, 2023

(54) ADAPTIVE POWER SUPPLY

(71) Applicant: Rohde & Schwarz GmbH & Co. KG, Munich (DE)

(72) Inventors: Philipp Weigell, Baierbrunn (DE); Sascha Kunisch, Haibach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 255 days.

(21) Appl. No.: 16/941,441

(22) Filed: Jul. 28, 2020

(65) Prior Publication Data

US 2022/0035428 A1   Feb. 3, 2022

(51) Int. Cl.

| | |
|---|---|
| *G06F 11/30* | (2006.01) |
| *G06F 1/28* | (2006.01) |
| *G05F 1/66* | (2006.01) |
| *G01R 21/06* | (2006.01) |
| *H02H 1/00* | (2006.01) |
| *G06N 20/00* | (2019.01) |
| *G05F 1/46* | (2006.01) |
| *G06F 1/30* | (2006.01) |

(52) U.S. Cl.
CPC .............. *G06F 1/28* (2013.01); *G01R 21/06* (2013.01); *G05F 1/46* (2013.01); *G05F 1/66* (2013.01); *G06N 20/00* (2019.01); *H02H 1/0092* (2013.01); *G06F 1/30* (2013.01)

(58) Field of Classification Search
CPC .. G06F 1/28; G06F 1/26; G01R 21/06; G01R 19/16538; G05F 1/46; G05F 1/66; G06N 20/00; G06N 10/80; H02H 1/0092

USPC .......................................................... 713/340
See application file for complete search history.

(56) References Cited

U.S. PATENT DOCUMENTS

| | | | |
|---|---|---|---|
| 8,086,355 B1 | 12/2011 | Stanczak et al. | |
| 10,338,614 B1 * | 7/2019 | Day | ........................ G05F 1/575 |
| 10,741,363 B1 * | 8/2020 | Burry | ..................... H03H 11/28 |
| 11,069,926 B1 * | 7/2021 | Kohn | ....................... B60L 58/10 |
| 11,097,633 B1 * | 8/2021 | Kohn | .................. H01M 10/425 |
| 2002/0057061 A1 | 5/2002 | Mueller et al. | |
| 2004/0104707 A1 | 6/2004 | May et al. | |
| 2006/0033650 A1 * | 2/2006 | Leung | ...................... H03K 7/08 |
| | | | 341/143 |
| 2007/0016337 A1 | 1/2007 | Iwagami et al. | |
| 2007/0200531 A1 | 8/2007 | Armiroli et al. | |
| 2009/0021968 A1 | 1/2009 | Komatsu et al. | |

(Continued)

FOREIGN PATENT DOCUMENTS

| | | |
|---|---|---|
| CN | 200994112 Y | 12/2007 |
| CN | 102222931 A | 10/2011 |

(Continued)

*Primary Examiner* — Volvick Derose
(74) *Attorney, Agent, or Firm* — Potomac Technology Law, LLC

(57) ABSTRACT

A power supply comprises a control unit for adjusting a power output by the power control unit in response to a control signal. The power supply further includes a processing unit configured to generate the control signal using a control model and based at least on one or more sensor signals supplied to the processing unit. The processing unit is configured to communicate via an interface with an external processing entity to receive a data set for generating the control model and/or to receive the control model, and/or to transmit the model to the external processing entity.

4 Claims, 1 Drawing Sheet

(56) References Cited

U.S. PATENT DOCUMENTS

| | | | |
|---|---|---|---|
| 2009/0083019 A1* | 3/2009 | Nasle | G06F 30/18 |
| | | | 715/275 |
| 2009/0134823 A1 | 5/2009 | Jeung | |
| 2010/0187914 A1 | 7/2010 | Rada et al. | |
| 2010/0264846 A1 | 10/2010 | Chemel et al. | |
| 2012/0191439 A1* | 7/2012 | Meagher | G06F 30/20 |
| | | | 703/18 |
| 2014/0028219 A1 | 1/2014 | Chen et al. | |
| 2014/0042996 A1* | 2/2014 | Lau | G05F 1/462 |
| | | | 323/234 |
| 2014/0159806 A1 | 6/2014 | Kim et al. | |
| 2014/0213251 A1 | 7/2014 | Hasegawa | |
| 2014/0222226 A1 | 8/2014 | Bell | |
| 2014/0285090 A1 | 9/2014 | Chemel | |
| 2014/0368060 A1 | 12/2014 | Berberich et al. | |
| 2015/0105930 A1 | 4/2015 | Sparrowhawk | |
| 2015/0192944 A1* | 7/2015 | Tsao | G06F 1/266 |
| | | | 700/295 |
| 2016/0224046 A1 | 8/2016 | Hsieh et al. | |
| 2018/0017602 A1 | 1/2018 | Gavrilov et al. | |
| 2018/0123441 A1 | 5/2018 | Yanai | |
| 2018/0132325 A1 | 5/2018 | Chemel et al. | |
| 2019/0195923 A1 | 6/2019 | Ohori et al. | |
| 2019/0267694 A1* | 8/2019 | Fischer | H01Q 1/002 |
| 2019/0326780 A1* | 10/2019 | Zeighami | H02J 3/382 |
| 2020/0250109 A1* | 8/2020 | Yaacov | G06F 13/10 |
| 2021/0043985 A1* | 2/2021 | Fan | H01M 10/4264 |
| 2021/0057920 A1* | 2/2021 | Husain | H02J 7/0013 |

FOREIGN PATENT DOCUMENTS

| | | |
|---|---|---|
| CN | 204598885 U | 9/2015 |
| CN | 104965558 A | 10/2015 |
| CN | 106055019 A | 10/2016 |
| CN | 106325348 A | 1/2017 |
| CN | 107168441 A | 9/2017 |
| CN | 107239055 A | 10/2017 |
| CN | 107765755 A | 3/2018 |
| CN | 207650683 U | 7/2018 |
| CN | 108551266 A | 9/2018 |
| CN | 109557445 A | 4/2019 |
| DE | 4106317 A1 | 9/1992 |
| DE | 102015005429 A1 | 3/2015 |
| EP | 1043774 A1 | 10/2000 |
| EP | 1465464 A2 | 10/2004 |
| EP | 1708409 A2 | 10/2006 |
| EP | 1764947 A2 | 3/2007 |
| EP | 2023227 A1 | 10/2007 |
| EP | 1895648 A2 | 3/2008 |
| EP | 1931026 A2 | 6/2008 |
| EP | 2287777 A1 | 2/2011 |
| EP | 2341523 A1 | 7/2011 |
| EP | 2418749 A1 | 2/2012 |
| EP | 2533390 A2 | 12/2012 |
| EP | 2560073 A1 | 2/2013 |
| EP | 2602894 A1 | 6/2013 |
| EP | 2698908 A2 | 2/2014 |
| EP | 2985670 A1 | 10/2014 |
| EP | 3229336 A1 | 8/2017 |
| EP | 3410133 A1 | 12/2018 |
| EP | 3641091 A1 | 4/2020 |
| WO | WO9910867 A1 | 3/1999 |
| WO | WO0057543 A1 | 9/2000 |
| WO | WO02099552 A1 | 12/2002 |
| WO | WO03102890 A2 | 12/2003 |
| WO | WO2005051051 A2 | 6/2005 |
| WO | WO2005109624 A1 | 11/2005 |
| WO | WO2006015000 A2 | 2/2006 |
| WO | WO2007088577 A1 | 8/2007 |
| WO | WO2008055084 A2 | 5/2008 |
| WO | WO2008097591 A2 | 8/2008 |
| WO | WO2008131136 A1 | 10/2008 |
| WO | WO2009051870 A1 | 4/2009 |
| WO | WO2009117690 A1 | 9/2009 |
| WO | WO2010029315 A2 | 3/2010 |
| WO | WO2010042200 A1 | 4/2010 |
| WO | WO2010129691 A2 | 11/2010 |
| WO | WO2010139020 A1 | 12/2010 |
| WO | WO2010141896 A2 | 12/2010 |
| WO | WO2011046645 A1 | 4/2011 |
| WO | WO2011091444 A1 | 7/2011 |
| WO | WO2011112506 A2 | 9/2011 |
| WO | WO2011146695 A2 | 11/2011 |
| WO | WO2012010613 A1 | 1/2012 |
| WO | WO2012024542 A2 | 2/2012 |
| WO | WO2012050635 A1 | 4/2012 |
| WO | WO2012064906 A2 | 5/2012 |
| WO | WO2012174348 A2 | 12/2012 |
| WO | WO2013016542 A2 | 1/2013 |
| WO | WO2014210514 A1 | 12/2014 |
| WO | WO2015009908 A1 | 1/2015 |
| WO | WO2016004433 A1 | 1/2016 |
| WO | WO2017087130 A1 | 5/2017 |

* cited by examiner

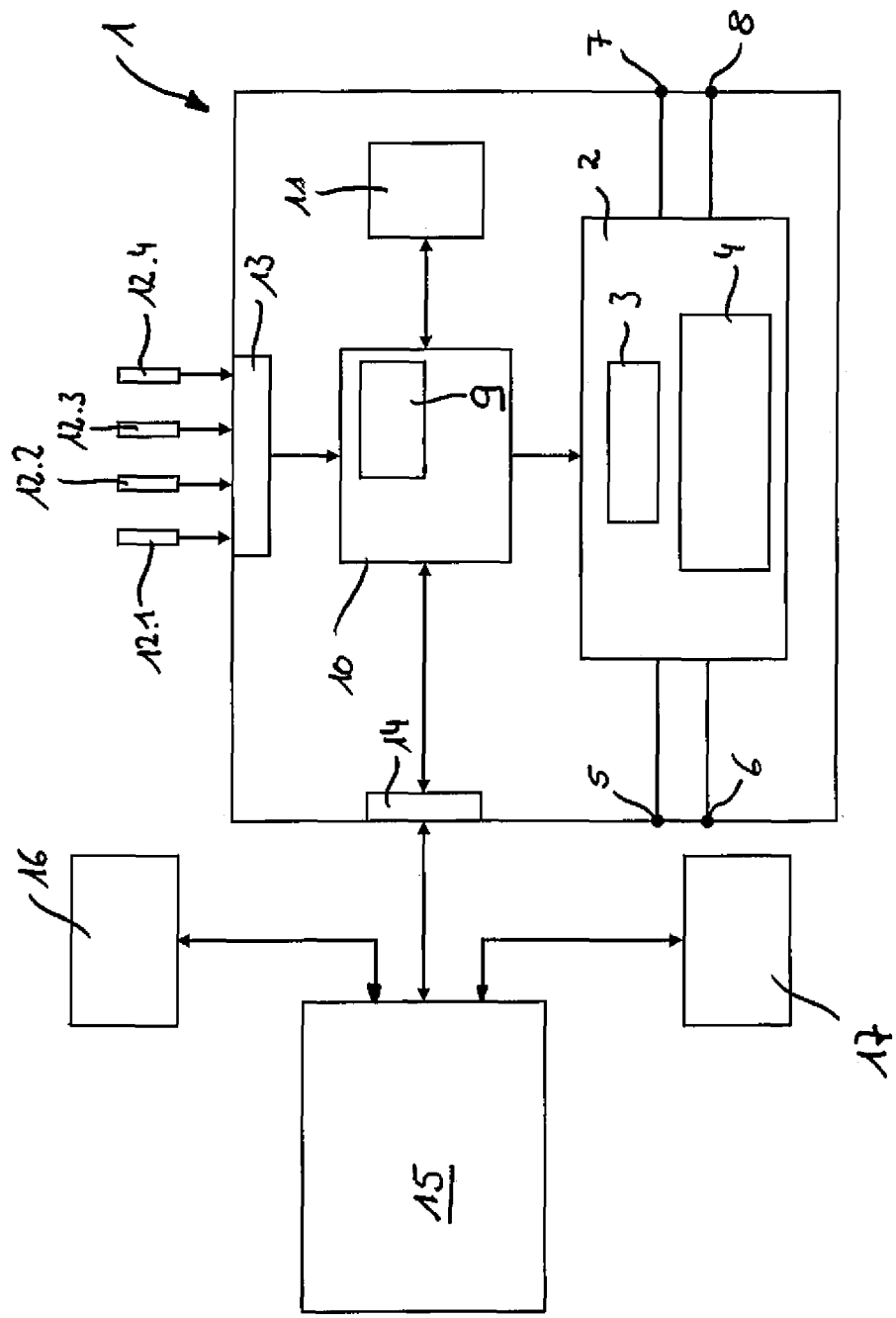

ADAPTIVE POWER SUPPLY

TECHNICAL FIELD

The invention regards and adaptive power supply capable of adjusting the electrical output in response to a measured parameter.

BACKGROUND

For a very long time, control of settings that were used in processes had to be monitored by well-trained personal who were educated to adjust the equipment involved in the process. An example is a manufacturing process in which parameters of a machine change during the process in order to achieve a result with satisfying quality. In order to assist the human operator, the amount of information provided and on which the operator's decision has to be based has been increased. However, the downside of an increased amount of information is that the operator may be overburdened and the measures taken by the operator do not lead to a satisfying result. This is specifically problematic when the achieved result and thus the final product is sensitive to varying process parameters and when reproducibility is a characteristic of quality.

For increasing reproducibility, processes have been established based on long test series using trial and error in order to set a time sequence of process parameters, which presumably lead to the desired result. Nevertheless, reproducibility still is not perfect because changing environmental conditions sometimes make an adaptation of the process parameters necessary to reasonably respond to changing conditions.

Many processes, like for example galvanization or electroplating, can be controlled directly by controlling the applied electrical values of voltage and current. Optimized adjustment of these electrical values directly leads to an improvement of quality and yield and, finally, of cost efficiency. Since there is an increasing demand for battery cell production for which such processes are essential, it can easily be understood that low-quality output must be avoided and cost efficiency is crucial for the success of the manufacturer. However, up to now only a manual intervention by an operator or using an external and predefined script defining target values for the output voltage and current are used to change the process parameters over time during the manufacturing process. In case that an external script is used it is impossible to respond to a deviation from a desired progress even in case that a deviation from the target value of the obtained product is recognized. Having a human operator on the other hand does not ensure that reproducibility reaches the desired level. Further, in many cases it is impossible for a human operator to correctly take into consideration interactions between a plurality of related parameters.

Adjustable power supplies are known in the art, for example from US 2014/0042996 A1. However, adaptability of such power supplies is very limited and may only respond to preset environmental conditions, for which fixed output values are set in advance. Corrections are performed only based on the feedback loop that feeds back the achieved output values of current and voltage. However, no measurement of external parameters are used to execute corrections. This lack of flexibility makes the known power supplies unusable for more complex applications like the manufacturing processes mentioned above.

Consequently, there is a need for a power supply that can be applied in more complex scenarios with the capability of automatically responding to changing process parameters and/or environmental conditions, but also advancement in the process.

SUMMARY

Embodiments of the present invention advantageously address the foregoing requirements and needs, as well as others, by providing a power supply that can be applied in more complex scenarios with the capability of automatically responding to changing process parameters and/or environmental conditions, but also advancement in the process.

This object is achieved by the power supply according to the present invention.

A power supply according to the invention comprises a control unit and a processing unit configured to generate a control signal for the control unit. Based on this control signal, the control unit generates and outputs a supply voltage and current. Thus, the output voltage and current can be controlled by varying the control signal. This enables to optimize the electrical output to the current status of a process that needs an adaptation of the electrical parameters over time. According to the invention, the adaptation is caused by the processing unit generating the control signal based at least on one or more sensor signals, wherein the generation of the control signal is performed using a control model, which, as an input, uses at least the one or more sensor signals.

Generally, the sensors can physically sense any parameter that either directly describes the characteristic of a result of the process or that is known to influence the process in a known manner. An example for a parameter that directly characterizes the outcome of the process is a measured thickness of a layer growing in the galvanization process. The sensor used to provide information for the processing unit may be one or a plurality of the following: temperature sensor, optical sensor, transparency sensor, conductivity sensor, a camera, ultrasonic sensor, RF sensor, radar sensor, surface sensor, hydrogen sensor, or oxygen sensor. In addition to measuring a characteristic of the produced results of the process also environmental conditions may be measured. For example, the environmental temperature, humidity or the like may have an influence on the achieved result.

In order to provide the processing unit with the control model to be used when generating the control signal, the power supply further comprises an interface. The interface is connected to the processing unit, which can, via the interface, be provided with data based on which the processing unit may generate the control model to be used. Providing the interface enables to set up the control model externally, for example, in an external processing entity and, having decided that such off-line generated control model is capable to produce reasonable results, forward from externally the control model to the processing unit. Alternatively, the processing unit can be provided with data, from which it generates the control model internally.

On the other hand, the interface may also be used to transfer the control model that is locally used by the processing unit to the external processing entity. Thus, providing an interface and configuring the processing unit to communicate with an external processing entity enables the exchange of control models between different entities, in particular, at least indirectly between a plurality of power supplies. The control model that is used in one power supply may thus also be made available to other power supplies being configured in a similar way as the inventive power supply. The exchange, particularly in case of a bidirectional communication between an external processing entity, for example a server in the network, allows to exchange data between a plurality of individual power supplies. Thus, controlling the process is performed by an adaptation of the electrical output of the power supply in the process may benefit from data gathered at another place or, at least, a control model derived therefrom.

The dependent claims define further advantageous aspects of the present invention.

It is specifically advantageous if one of the parameters used for generating the electrical output of the power supply is the advancement in time. Even for unchanged sensor values that are provided to the processing unit, changing electrical output of the power supply depending on the current state of the process might be required. For example, at the beginning of the process a higher (or lower) voltage or current may be needed then at a later point in time, for example, at the end of a manufacturing process. Preferably, in order to control the output values while process advances, a timer is reset anytime a new process is started and the current time of value is used as an input value for the control model.

Further, it is preferred that the processing unit uses a machine learning algorithm for generating the control model. The machine learning is performed based on training data that is provided over the interface as received data for the processing unit. Thus, the control model may be established in a first phase, namely a training phase. Thereafter, during executing in a manufacturing process the established control model can then be used in an operation phase.

As it has been mentioned before, the control model once generated in the processing unit can also be transferred to the external processing entity in order to be distributed to other power supplies as well. Thus, it is particularly preferred that the interface is operable bidirectional so that it can be used for supplying training data to the processing unit, where a control model is created and also to send back the control model after being created. The control model is only created once and can then be transferred back to the server as external processing entity so that other power supplies can retrieve the generated control model.

It is to be noted that each power supply comprises a memory for storing the generated or received control model. Of course, it is also possible to store a plurality of different control models in the memory so that the power supply can be used in different manufacturing processes. Further, it is to be noted that for explanations is always referred to a manufacturing process but any kind of process that needs an adaptation of output values of a power supply may benefit from the present invention.

As indicated above already, the power supply according to the invention is particularly suitable for adjusting electrical values output by the power supply varying over time. This is achieved by repetitively or continuously generating the control signal based on current sensor signals. The repetition interval may be adjusted to the needs of the respective process and can specifically be shorter for processes having a high sensitivity with respect to changing parameters. Preferably, the sensors continuously provide their sensor signals to the processing unit which in turn samples the sensor signals.

It is further preferred that the control model is improved during operation of the power supply or dedicated additional training phases. This is achieved by refining the control model using the machine learning algorithm executed in the processing unit based on feedback information classifying the generated control signal. Thus, the achieved result of the process is classified as, for example, "satisfying" or "not satisfying", and using this feedback information the algorithm can redefine the parameters of the control model. Again, the interface may be used to transfer and distribute the refined model to make it available for other power supplies. Alternatively, additional training data may be available from other power supplies that can be used to generate additional training data received over the interface for refinement of the control model.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Exemplary embodiments of the invention are now further explained with respect to the drawings by way of example only, and not for limitation. In the drawings:

FIG. 1 shows a block diagram of an embodiment of the power supply.

DETAILED DESCRIPTION

A power supply that can be applied in more complex scenarios with the capability of automatically responding to changing process parameters and/or environmental conditions, but also advancement in the process, is provided. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

The power supply 1 shown as a block diagram in FIG. 1 comprises a control unit 2 for adjusting output values of an output voltage and output current. The power supply 1 is connectable to a main power supply using input terminals 5, 6. The control unit 2 generates the desired electrical output values for the voltage and current by transforming/converting the input voltage and input current. The control unit 2 of the power supply 1 is connectable to a load via output terminal 7, 8.

The control unit 2 comprises a controller 3 and a converter 4, which is internally in the control unit 2 controlled by the controller 3. The control unit 2 is adjustable and responds to the control signal, which is provided to the controller 3 which internally generates the signals to adjust the operation of the converter 4. Converters that are adjustable are known in the art and, thus, in order to avoid unnecessary elaborations, a detailed explanation thereof is omitted.

According to the invention, the power supply 1 comprises a processing unit 10 that generates the control signal and provides the control signal to the control unit 2. The processing unit 10 at least consists of a processor capable of calculating, using a control model, from obtained input parameters the control signal, which is then supplied to the control unit 2. The control model that is used for generating the control signal is stored in the memory 11 and can be obtained in a plurality of different ways as it will be explained below in greater detail.

The control model allows the processing unit 2 calculate from input parameters the output parameters, which are then encoded in the control signal to control the electrical output values of the power supply 1. The input parameters that are used in for the control model to calculate the control signal can be obtained from one or more sensors 12.$i$ that are connected to a sensor interface 13 of the power supply 1. The sensors will 12.$i$ physically sense parameters of results achieved by the process, process parameters and/or environmental parameters. Thereby, the input parameters describe observations of the advancement of the process. Typical sensors are: temperature sensor, optical sensor, transparency sensor, conductivity sensor, a camera, ultrasonic sensor, RF sensor, radar sensor, surface sensor, hydrogen sensor, or oxygen sensor. The enumeration of these typical sensors is not limited for applying the present invention. The sensors may be chosen in accordance with the process to be controlled by the adaptive power supply 1. Thus, any parameter that might influence the process or characterize the result of the executed process can be used as long as the control model takes account of the respective parameter. The number of sensors 12.$i$ that is illustrated in FIG. 1 is not limiting in the control model may also use less or more sensors.

The processing unit 10 is further configured to communicate over a network interface 14 with an external processing entity such as the server 15. The network interface 14 allows to exchange data between the server 15 and the processing unit 10.

Before the power supply 1 can be used in the process to output adapted electrical output values, the control model must be made available for the processing unit 10 for calculating the control signal from the input parameters. Generally, there are two options to make the control model available for the processing unit 10: First, the control model may be generated in the processing unit 10. Second, an off-line generated control model may be received via the network interface 14.

In order to generate the control model within the processing unit 10 of the power supply 1, training data is provided by the server 15 and obtained by the processing unit 10 via the network interface 14. The processing unit 10 uses a machine learning algorithm to generate the control model, which is stored in the memory 11 after being generated. In order to make the control model available for other power supplies 1 as well, the processing unit 10 may further be configured not only to store the control model in the memory 11 but also to transfer the control model 14 via the network interface 14 to the server 15. As it is indicated by the arrows for the power supply 16, 17 may be connected to the same server 15. These additional power supplies and not necessarily capable of generating the control model themselves but are equipped at least with a network interface 14 allowing them to obtain the control model stored and/or distributed by the server 15 so that based on the control model generated by the processing unit 10 of the power supply 1 further power supplies 16, 17 can also control their processes by adaptively generating a control signal for their own control unit.

Alternatively, the control model is generated off-line, for example, by the server 15, and provided by the network interface 14 to the processing unit 10. As it has been explained with reference to the additional power supply 16 or 17, it is possible in such a case to use an externally generated control model received via the network interface 14 and store it in the memory 11. In both cases, the power supply 1 stores a control model in the memory 11 that is used by the processing unit 10 to calculate the control signal output to the control unit 2.

Generally, such a control model may be used to generate the control signal based on sensor signals received via the sensor interface 13 at a specific point in time. However, the preferred application of the invention is an adaptation of the control signal over time. Thus, in addition to the values received from the sensors 12.$i$, time information is used to calculate the control signal. The processing unit 10 preferably comprises an internal timer 9, which is reset anytime that the process is started anew. Such a timer 9 might be a simple counter and the counter value is used as an input parameter for calculating the control signal from the control model. Alternatively, external time information may be used, for example, based on the clock that is also used in the control unit 2. The time interval between repetitive calculation of the control signal based on new time information and current sensor signals may be set either constant for the whole process or depending on the state of the process. The reduction of the time interval can lead to a continuous adaptation of the control signal. "Continuous" in the sense of the present invention is to be understood as using very short time intervals compared to the duration of the process.

For illustration reasons only, the memory 11 is shown as a distinct component. It is understood that the memory 11 may also be included in the processing unit 10. Further, machine learning algorithms per se that are used to generate models in the above-described manner allowing a processing unit 10 to calculate an output signal from input parameters are known in the art and can be selected accordingly. For the present invention it is important that the power supply 1 comprises the network interface 14 allowing to input data based on which training of such an algorithm can be performed were over which an externally generated model may be important. Further, the same interface 14, or a dedicated additional interface (not shown in the drawing) can be used to provide feedback information during operation of the power supply 1. Such feedback information classifying the control signal generated using the control model can then be used to refine the control model by the processing unit 10. The refined control model is then stored in the memory 11 and is used for future operation of the power supply 1.

The processing unit 10 may also be configured to automatically transfer such a refined control model over the network interface 14 to the server 15 in order to immediately distribute the new control model to other power supply 16, 17.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A power supply comprising:
   a controller configured to adjust a power output by the controller for use in a process, wherein the adjustment of the power output is in response to a control signal;
   a processor configured to generate the control signal using a control model and based at least on one or more sensor signals supplied to the processor and on advancement in time of the process; and
   wherein the processor is configured to communicate via an interface with an external processing entity to receive a data set for generating the control model or to receive the control model, and/or to transmit the control model to the external processing entity.

2. The power supply according to claim 1, wherein the received data set is a training data set, and wherein the processor is configured to execute a machine learning algorithm for generating the control model.

3. The power supply according to claim 1, wherein the processor is configured to repetitively or continuously generate the control signal based on one or more current sensor signals.

4. The power supply according to claim 1, wherein the processor is configured to refine the control model based on feedback information classifying the control signal.

* * * * *